US010060615B2

(12) United States Patent
Luo

(10) Patent No.: US 10,060,615 B2
(45) Date of Patent: Aug. 28, 2018

(54) EASILY CONTROLLABLE UMBRELLA WITH LIGHTING ELEMENTS

(71) Applicant: PHAETON MANUFACTURING LLC., Nantong (CN)

(72) Inventor: Xiong Luo, Nantong (CN)

(73) Assignee: Phaeton Manufacturing LLC, Nantong (CN)

( * ) Notice: Subject to any disclaimer, the term of this patent is extended or adjusted under 35 U.S.C. 154(b) by 92 days.

(21) Appl. No.: 15/334,967

(22) Filed: Oct. 26, 2016

(65) Prior Publication Data

US 2017/0122547 A1 May 4, 2017

(30) Foreign Application Priority Data

Nov. 4, 2015 (CN) ..................... 2015 2 0873971 U

(51) Int. Cl.
*F21V 33/00* (2006.01)
*A45B 3/02* (2006.01)
(Continued)

(52) U.S. Cl.
CPC ............ *F21V 33/006* (2013.01); *A45B 23/00* (2013.01); *A45B 25/00* (2013.01); *A45B 25/02* (2013.01); *E04H 12/2238* (2013.01); *E04H 12/2276* (2013.01); *F21V 23/003* (2013.01); *A45B 2023/005* (2013.01); *A45B 2023/0006* (2013.01); *A45B 2023/0037* (2013.01); *A45B 2025/003* (2013.01); *A45B 2200/1009* (2013.01); *A45B 2200/1018* (2013.01); *H05K 999/99* (2013.01)

(58) Field of Classification Search
CPC ........ F21V 33/006; F21V 23/06; F21V 25/04; A45B 3/04; A45B 2200/1018; E04H 12/2238; E04H 12/2246; E04H 12/2253; E04H 12/2261; E04H 12/2276; E04H 12/2284; E04H 12/2292
See application file for complete search history.

(56) References Cited

U.S. PATENT DOCUMENTS

2003/0067765 A1* 4/2003 Li ............................ A45B 3/04 362/102
2003/0230331 A1* 12/2003 Li ............................ A45B 3/04 362/7

(Continued)

*Primary Examiner* — Anh Mai
*Assistant Examiner* — Steven Horikoshi
(74) *Attorney, Agent, or Firm* — Wang Law Firm, Inc.

(57) ABSTRACT

An easily controllable umbrella includes a base, a column, an umbrella frame, lighting elements, a control device for controlling the lighting elements, a power supply assembly with a power plug for powering the lighting elements, a control panel, a touch control circuit board, and a remote control circuit board; the lighting elements, the control panel, the touch control circuit board, the remote control circuit board and the power plug form a lighting circuit, and the remote control circuit board controls the touch control circuit board. The control device includes a touch control circuit board and a remote control circuit board, remote control of the umbrella being realized through a remote control signal-matched with a receiver on the remote control circuit board, touch control of the umbrella being realized by pressing the umbrella. That is, the umbrella can support both remote control and touch control.

5 Claims, 6 Drawing Sheets

(51) Int. Cl.

| | |
|---|---|
| ***A45B 25/00*** | (2006.01) |
| ***A45B 23/00*** | (2006.01) |
| ***E04H 12/22*** | (2006.01) |
| ***A45B 25/02*** | (2006.01) |
| ***F21V 23/00*** | (2015.01) |

(56) References Cited

U.S. PATENT DOCUMENTS

| | | | | |
|---|---|---|---|---|
| 2007/0074751 | A1* | 4/2007 | Fraser | A45B 3/04 135/98 |
| 2007/0127231 | A1* | 6/2007 | Li | A45B 3/00 362/102 |
| 2009/0056775 | A1* | 3/2009 | Kuelbs | A45B 3/04 135/16 |
| 2010/0037929 | A1* | 2/2010 | Liu | A45B 17/00 135/20.3 |
| 2010/0307547 | A1* | 12/2010 | Li | A45B 3/00 135/16 |
| 2013/0273869 | A1* | 10/2013 | Parker | G04G 13/02 455/269 |
| 2015/0216273 | A1* | 8/2015 | Akin | A45B 25/00 135/16 |
| 2015/0362171 | A1* | 12/2015 | Li | F21V 33/006 362/102 |

* cited by examiner

EASILY CONTROLLABLE UMBRELLA WITH LIGHTING ELEMENTS

FIELD OF THE INVENTION

The present invention relates to the field of umbrellas, in particular to an easily controllable umbrella.

DESCRIPTION OF THE PRIOR ART

An easily controllable umbrella is an umbrella which is mainly used to avoid the direct radiation of sunlight and usually used in the beaches, at the swimming pools or in the gardens. As a umbrella can keep out both sunlight and rain and also can create an atmosphere of suburban life, more and more cafes or restaurants also use sunshades for outdoor tables.

However, since it is dark at night, it is not easy for people to identify the position of a umbrella clearly by light from external lighting equipment. Particularly, the umbrella itself may block light from the surrounding so that the brightness under the umbrella is lower.

In order to improve the problem, Chinese Patent CN2595220Y, titled "LIGHTING UMBRELLA", disclosed an umbrella having a lighting function, thereby solving the problem of low brightness under the umbrella. However, the way of controlling the lighting of an existing umbrella is monotonous. For example, in patents such as the above-described patent titled "LIGHTING UMBRELLA" and China Patent CN 202698003 U titled "AUTOMATIC SOLAR UMBRELLA WITH REMOTE CONTROL", the lighting of an umbrella can be controlled only remotely, and the umbrella is thus inconvenient to use.

SUMMARY OF THE INVENTION

A technical problem to be solved by the present invention is, in view of the prior art, to provide an easily controllable umbrella, the lighting of which can be controlled by two methods of remote control and touch control. Thus it is convenient to use the umbrella an optical protective material protecting against UV light and blue light.

To solve the technical problem, the easily controllable umbrella, comprises a base; a column inserted into the base; an umbrella frame with a plurality of ribs, connected to the column; a plurality of lighting elements attached to the plurality of ribs; a control device used for controlling the plurality of lighting elements; a power supply assembly with a power plug for powering the plurality of lighting elements, and wherein the control device further comprises a control circuit, a touch control circuit board, and a remote control circuit board; the plurality of lighting elements, the control circuit, the touch control circuit board, the remote control circuit board and the power plug form a lighting circuit, and the remote control circuit board controls the touch control circuit board.

In order to make the mounting of the lighting elements more easy, preferably, the plurality of lighting elements comprises light bars respectively disposed on the plurality of ribs.

Preferably, each of the plurality of ribs is U-shaped and has a U-shaped groove for receiving a light bar and a neck for receiving a lampshade. During the assembly, the light bars are embedded into the U-shaped groove, and then the lampshade matched with the U-shaped groove is clamped into the neck. In this way, the lighting elements are completely assembled.

In order to make the arrangement of circuits in the interior of the umbrella more easy, and make the touch control of the umbrella more easy, preferably, the control circuit is disposed on the top of the umbrella frame, and the touch control circuit board, the remote circuit board and the power plug of the power supply assembly are all disposed in an inner chamber of the column.

The umbrella of the present invention can be one structure of multiple existing umbrellas, one of which is preferably as follows: the column further comprises a hollow stand column, a first slant rod with a front end and a rear end and a cross rod with an upper end and a lower end, wherein the hollow stand column is inserted on the base, the lower end of the cross rod is connected on the stand column through a first sliding sleeve slidably attached to the hollow stand column, of the first sliding sleeve sliding up and down the hollow stand column, the upper end of the cross rod is connected to the umbrella frame, and the front end and the rear end of the first slant rod are respectively hinged to the top end of the stand column and the middle of the cross rod; and the touch control circuit board, the remote control circuit board connected to the control circuit through wires passing through the first slant rod and/or the cross rod.

When the umbrella is of the structure described above, there can be multiple implementations for the power supply assembly. For example, the power supply assembly includes a power supply element and a power plug, and when the power supply element is a power supply, one end of the power supply is connected to the commercial power 220 V and the other end thereof is plug-in connected with the power plug; and preferably, the power supply assembly further comprises an upper conductive base and a lower conductive base disposed on the hollow stand column; the upper conductive base has a positive spring and a negative spring inside the positive spring; the lower conductive base has a positive conductive sheet and a negative conductive sheet, and the negative conductive sheet and the positive conductive sheet are fixed into the lower conductive base in such a way that the negative conductive sheet is sleeved inside the positive conductive sheet; and the upper conductive base and the lower conductive base are electrically connected to each other respectively through the positive spring and the negative conductive sheet and through the negative spring and the positive conductive sheet, and meanwhile, the lower conductive base is connecting to the power supply element.

Preferably, the middle of the base extends upward to form a mounting base into which the hollow stand column is inserted, a groove for receiving the lower conductive base is formed on the top of the mounting base, and the upper conductive base has a round hole formed thereon and is fixed onto the stand column through the round hole; additionally, a cavity matched with the power supply element is further formed on the base, with the power supply element being mounted in the cavity and fixed by a cover plate. A third circuit is provided between the bottom of the cavity and the bottom of the groove, by which the power supply element is connected to the lower conductive base.

Another preferred structure of the column is as follows: the column comprises a stand column, a second slant rod with two ends and a hollow bent arm with a front end and a lower end; the stand column is disposed on the base, the front end of the bent arm is connected to the umbrella frame and the lower end thereof is connected to one end of the second slant rod, the other end of the second slant rod is disposed on the stand column through a second sliding sleeve in such a way of being capable of sliding up and down, and an upper end of the stand column is connected to the middle of the bent arm in a rotatable manner; and the touch control circuit board, the remote control circuit board and the power plug are disposed in an inner chamber of the bent arm and connected to the control circuit through a circuit penetrated through the bent arm.

Compared with the prior art, in the present invention, the control device used for controlling the lighting elements includes a touch control circuit board and a remote control circuit board, the remote control of the umbrella can be realized through a remote control signal-matched with a receiver on the remote control circuit board, the touch control of the umbrella can be realized by pressing the umbrella (the specific part depends upon the part where the touch control circuit board is mounted). That is, the umbrella can support both remote control and touch control, and is thus easy to use.

DETAILED DESCRIPTION OF THE PREFERRED EMBODIMENT

To enable a further understanding of the present invention content of the invention herein, refer to the detailed description of the invention below:

Embodiment 1

Figure 1:
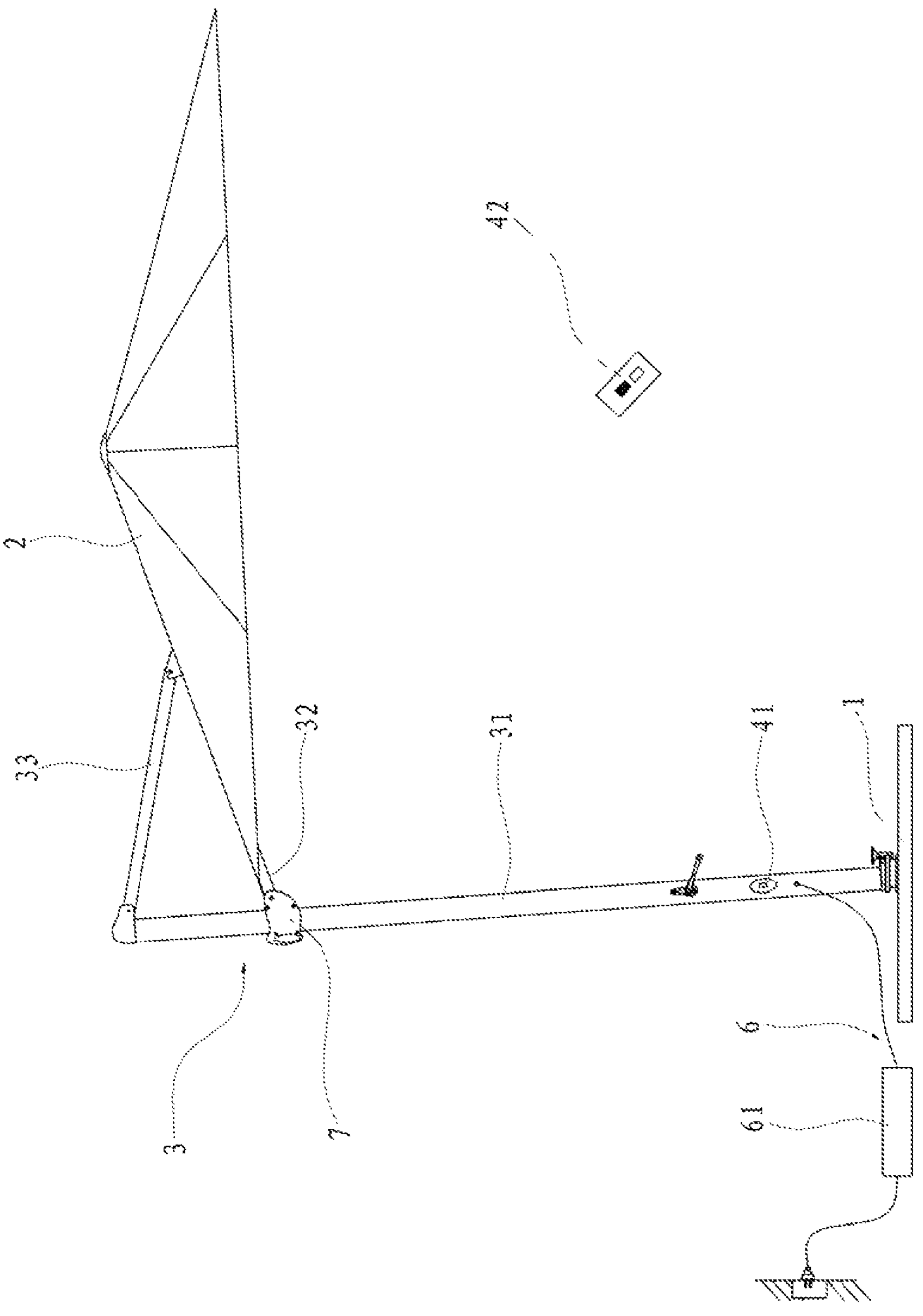
FIG. 1 is a schematic diagram of an easily controllable umbrella according to Embodiment 1 of the present invention.
Figure 2:
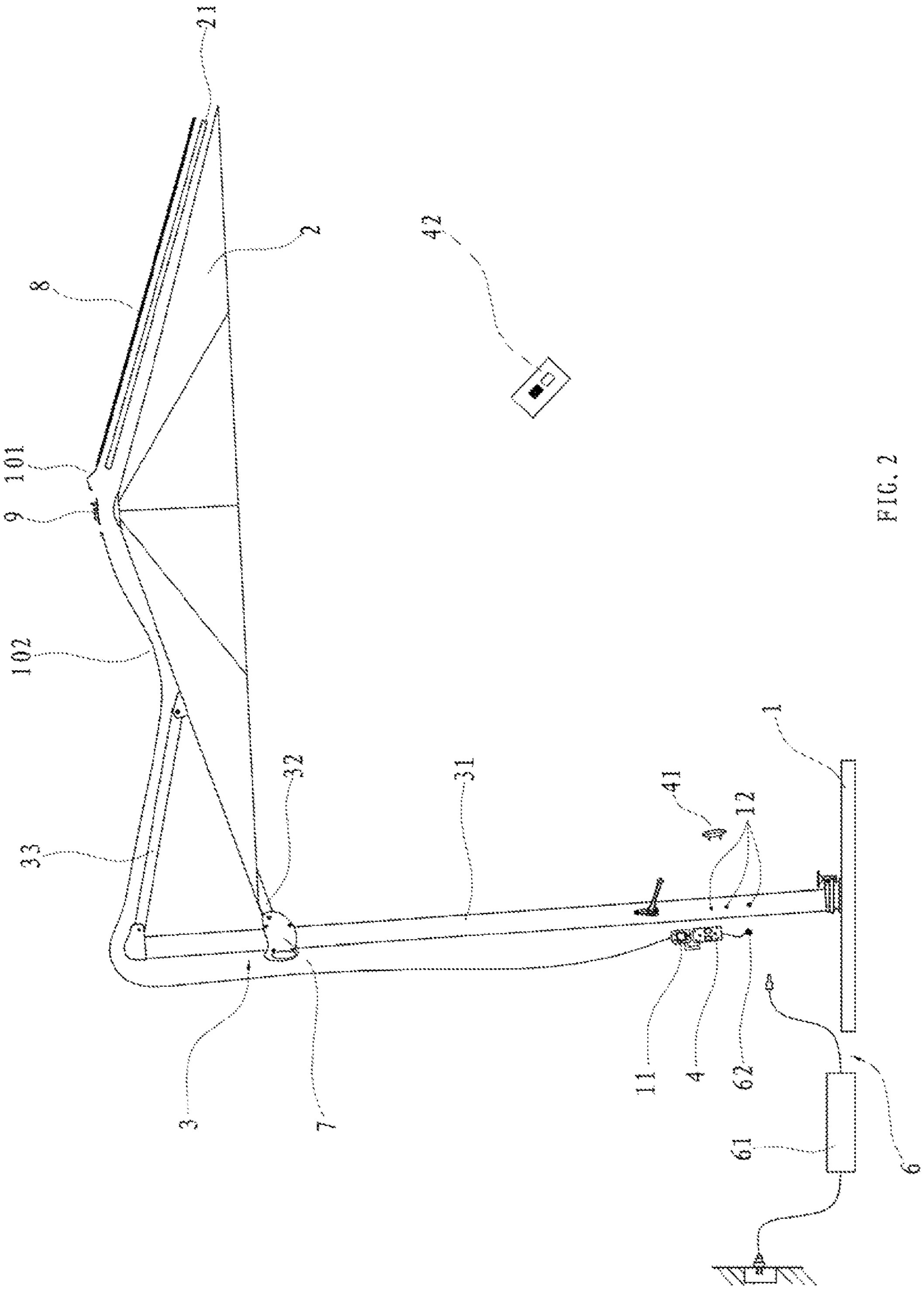
FIG. 2 is a partially exploded view of the easily controllable umbrella according to Embodiment 1 of the present invention.
Figure 3:
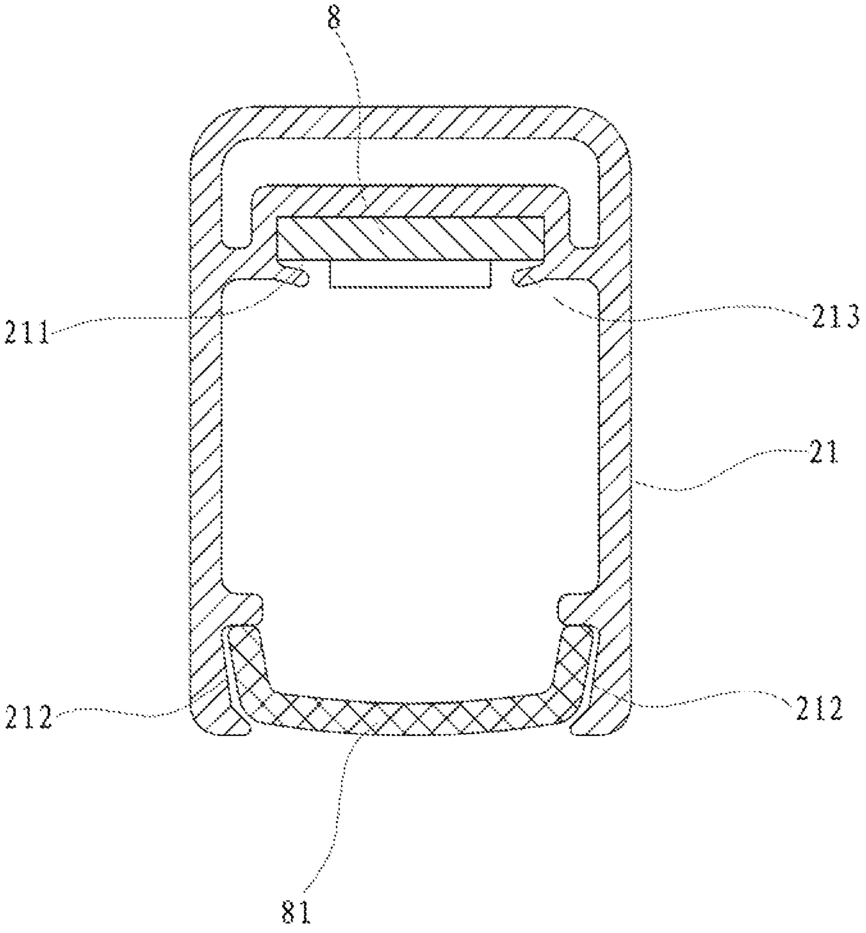
FIG. 3 is a sectional view of a rib of the easily controllable umbrella according to Embodiment 1 of the present invention.

FIG. 1-FIG. 3 show an easily controllable umbrella. The easily controllable umbrella comprise a base 1, a column 3 inserted into the base 1 and an umbrella frame 2 with a plurality of ribs 21, connected to the column 3, wherein the column 3 further comprises a hollow stand column 31, a first slant rod 33 with a front end and a rear end and a cross rod 32 with an upper end and a lower end, wherein the hollow stand column 31 is inserted on the base 1, the lower end of the cross rod 32 is connected on the stand column 31 through a first sliding sleeve 7 slidably attached to the hollow stand column, of the first sliding sleeve sliding up and down the hollow stand column, the upper end of the cross rod 32 is connected to the umbrella frame 2, and the front end and the rear end of the first slant rod 33 are respectively hinged to the top end of the stand column 31 and the middle of the cross rod 32.

The umbrella frame 2 has lighting elements 8 disposed thereon. Specifically, the plurality of lighting elements 8 comprises light bars respectively disposed on the plurality of ribs 21. Each of the plurality of ribs 21 is U-shaped and has a U-shaped groove 211 for receiving a light bar; a flange 213, used for limiting the light bars, is respectively provided on both sides at an opening of the groove 211; and a neck 212, for receiving a lampshade 81 is respectively formed on two inner wall surfaces at an opening of each of the ribs 21.

The umbrella further comprises a control device used for controlling the plurality of lighting elements 8. The control device comprises a control circuit 9 provided on the top of the umbrella frame 2, and a touch control circuit board 11, a remote control circuit board 4 and a power plug 62 of a power supply assembly 6 all provided in an inner chamber of the stand column 31. The power supply assembly 6 comprises the power plug 62 and power supply elements 61, wherein the light bars are connected to the control circuit 9 through a first circuit 101, the control circuit 9 is connected to the touch control circuit board 11, the remote control circuit board 4 and the power supply assembly 6 through a second circuit 102 to constitute a lighting circuit, the second circuit 102 is penetrated through the first slant rod 33 and the stand column, and the touch control circuit board 11, the remote control circuit board 4 and the power plug 62 are successively connected to each other by wires. To be convenient, in this embodiment, three first mounting holes 12 are formed at the lower end of the stand column 31, and the touch control circuit board 11, the remote control circuit board 4 and the power plug 61 are respectively fixed onto the stand column 31 by the first mounting holes 12. A receiver 41 is provided on the remote control circuit board 4, the remote control of the umbrella is realized through a remote control 42 signal-matched with the receiver 41, and the remote control circuit board 4 can start and stop the operation of the touch control circuit board 11. In this embodiment, the power supply element 61 is a power supply, one end of which is connected to the commercial power 220 V and the other end thereof is plug-in connected with the power plug 62.

When in use, the lighting elements 8 can be controlled by opening or closing the circuits by pressing any part of the stand column 31 by hands, and meanwhile, the lighting elements 8 can also be controlled by a remote control 42 and the touch circuit can be closed by the remote control circuit board 4, so that the umbrella can achieve the desired lighting effect just by remotely controlling the lighting elements 8.

Embodiment 2

Figure 4:
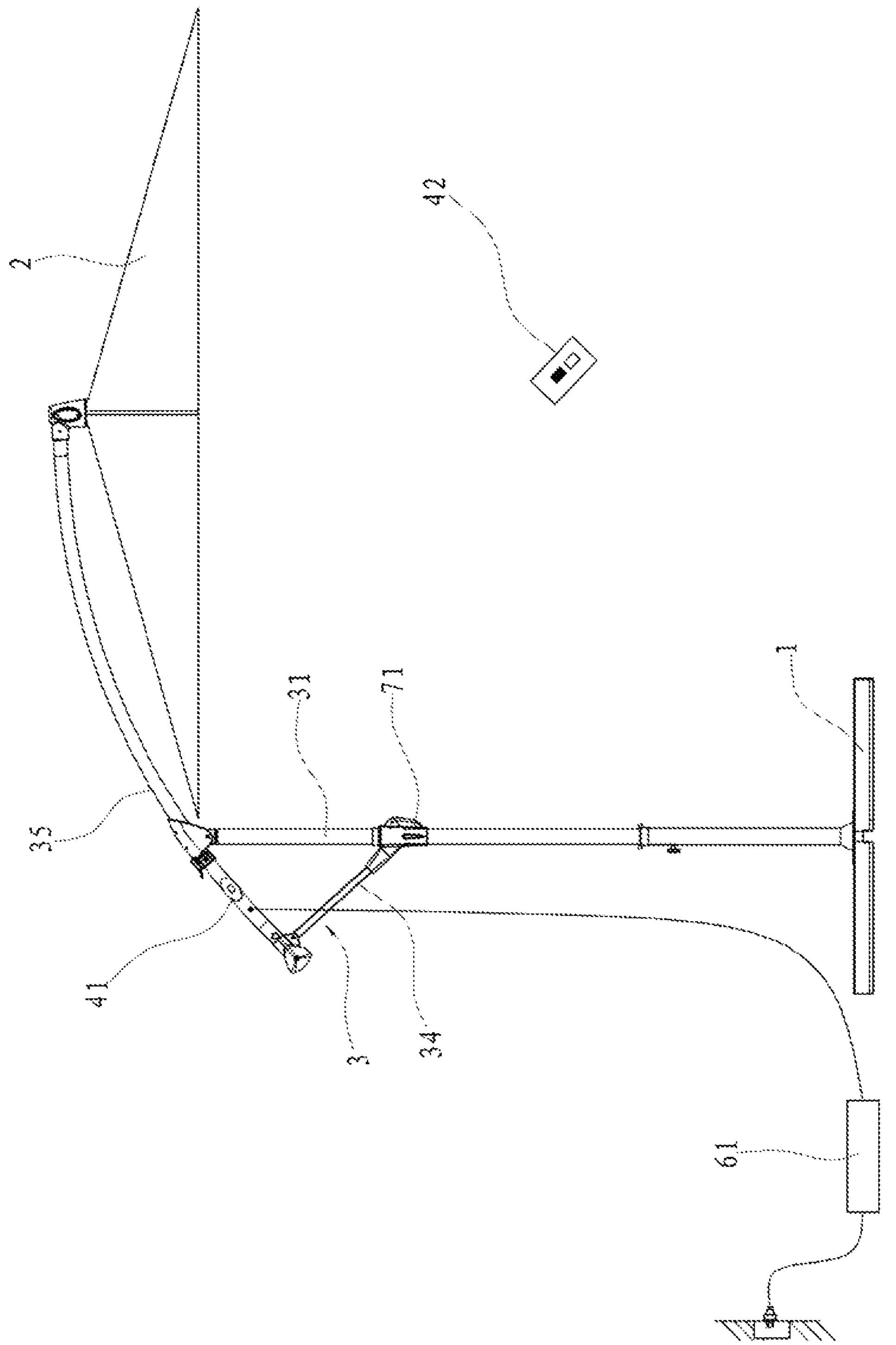
FIG. 4 is a schematic diagram of an easily controllable umbrella according to Embodiment 2 of the present invention.
Figure 5:
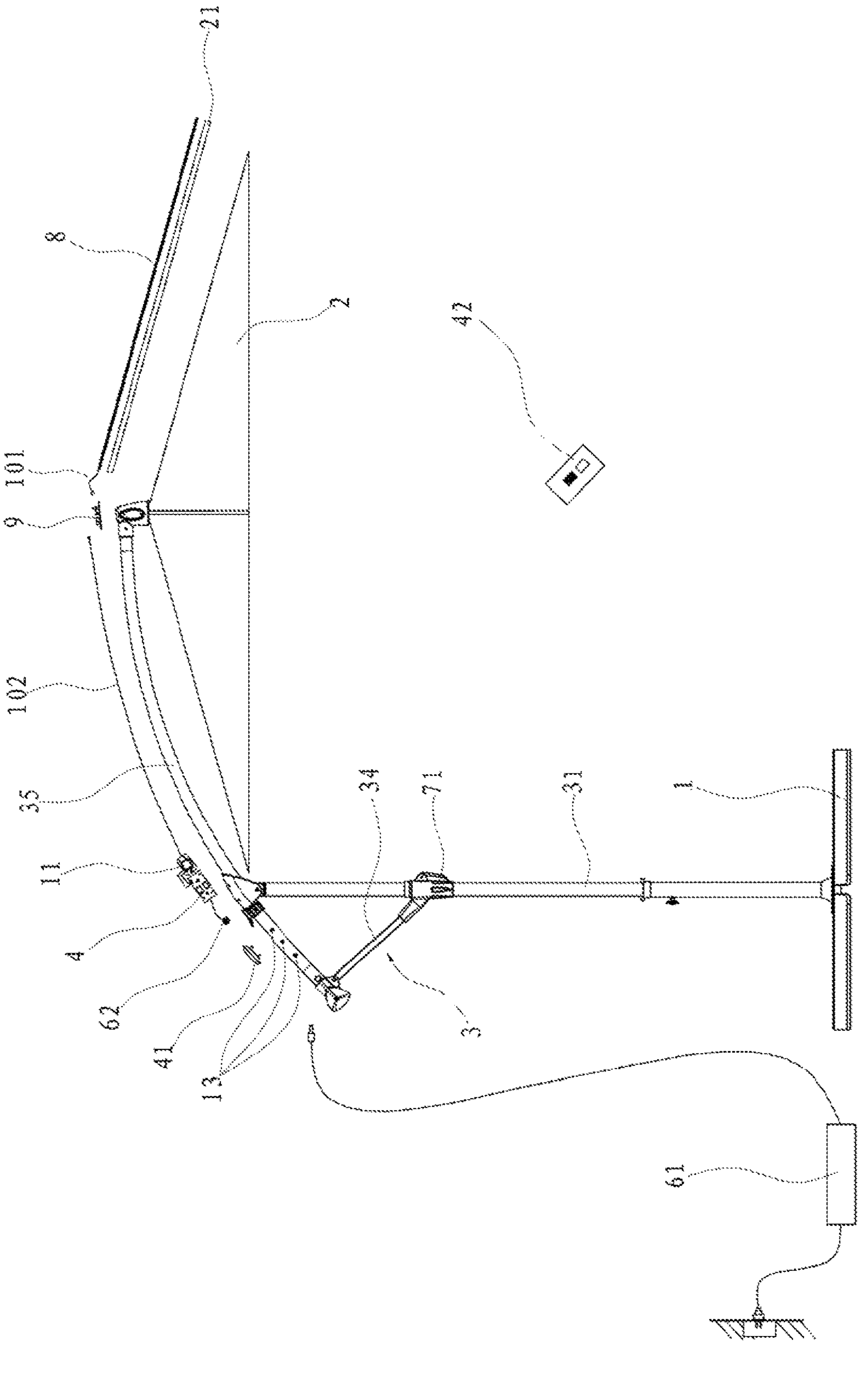
FIG. 5 is a partially exploded view of the easily controllable umbrella according to Embodiment 2 of the present invention.

Different with Embodiment 1, in Embodiment 2, FIG. 4-FIG. 5 show a column 3 of an easily controllable umbrella. The column 3 comprises a stand column 31, a second slant rod 34 with two ends and a hollow bent arm 35 with a front end and a lower end; the stand column 31 is disposed on the base 1, the front end of the bent arm 35 is connected to the umbrella frame 2 and the lower end thereof is connected to one end of the second slant rod 34, the other end of the second slant rod 34 is disposed on the stand column 31) through a second sliding sleeve 71 in such a way of being capable of sliding up and down, and an upper end of the stand column 31 is connected to the middle of the bent arm 35 in a rotatable manner; three second mounting holes 13 are formed at the lower end of the bent arm 35, and the touch control circuit board 11, the remote control circuit board 4 and the power plug 61 are respectively disposed in an inner chamber of the bent arm 35 and fixed onto the bent arm 35 by the second mounting holes 12. Besides, the touch control circuit board 11, the remote control circuit board 4 and the power plug 62 are connected to the control circuit 9 through the second circuit through the bent arm 35.

When in use, the lighting elements 8 can be controlled by opening or closing the circuits by pressing any part of the s bent arm 35 by hands, and meanwhile, the lighting elements 8 can also be controlled by a remote control 42 and the touch circuit can be closed by the remote control circuit board 4, so that the umbrella can achieve the desired lighting effect just by remotely controlling the lighting elements 8.

Embodiment 3

Figure 6:
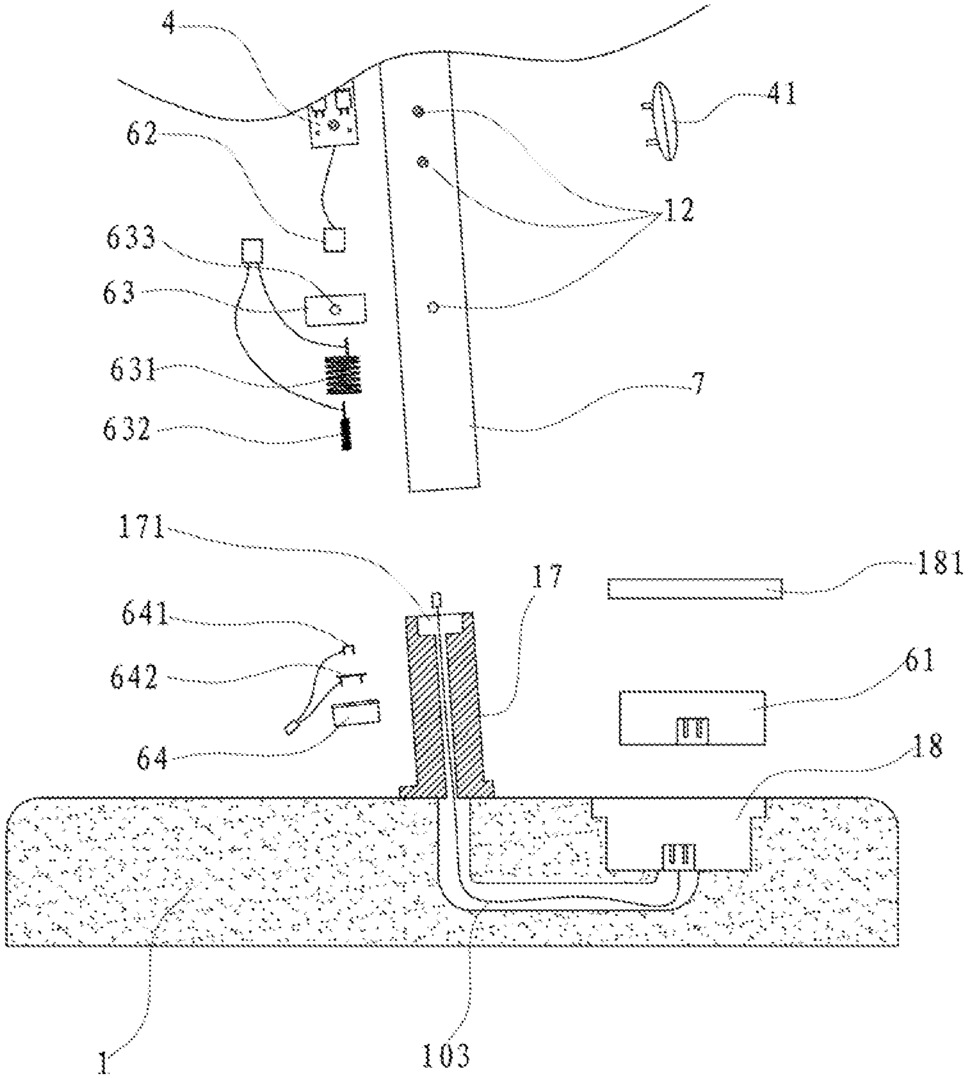
FIG. 6 is a schematic diagram of a power supply assembly according to Embodiment 3 of the present invention.

Different with Embodiment 1, in Embodiment 3, FIG. 6 shows a power supply assembly 6 further comprises an upper conductive base 63 and a lower conductive base 64 disposed on the hollow stand column 31; the upper conductive base 63 has a positive spring 631 and a negative spring 632 inside the positive spring 631; the lower conductive base 64 has a positive conductive sheet 641 and a negative conductive sheet 642, and the negative conductive sheet 642 and the positive conductive sheet 641 are fixed into the lower conductive base 64 in such a way that the negative conductive sheet 642 is sleeved inside the positive conductive sheet 641; and the upper conductive base 63 and the lower conductive base 64 are electrically connected to each other respectively through the positive spring 631 and the negative conductive sheet 642 and through the negative spring 632 and the positive conductive sheet 641, and meanwhile, the upper conductive base 63 is connected to the power plug 62 while the lower conductive base 64 is connecting to the power supply element 61.

Further, the middle of the base 1 extends upward to form a mounting base 17 into which the hollow stand column 31 is inserted, a groove 171 for receiving the lower conductive base 64 is formed on the top of the mounting base 17, and the upper conductive base 63 has a round hole 633 formed thereon and is fixed onto the stand column 31 through the round hole 633; additionally, a cavity 18 matched with the power supply element 61 is further formed on the base 1, with the power supply element 61 being mounted in the cavity 18 and fixed by a cover plate 181. A third circuit 103 is provided between the bottom of the cavity 18 and the bottom of the groove 171, by which the power supply element 61 is connected to the lower conductive base 64.

The invention claimed is:

1. An easily controllable umbrella, comprising:

a base;

a column inserted into the base;

an umbrella frame with a plurality of ribs, connected to the column;

a plurality of lighting elements attached to the plurality of ribs;

a control device used for controlling the plurality of lighting elements;

a power supply assembly with a power plug for powering the plurality of lighting elements, and wherein the control device further comprises a control circuit, a touch control circuit board, and a remote control circuit board, the control circuit is disposed on the top of the umbrella frame, and the touch control circuit board, the remote control circuit board and the power plug of the power supply assembly are all disposed in an inner chamber of the column;

the plurality of lighting elements, the control circuit, the touch control circuit board, the remote control circuit board and the power plug form a lighting circuit, and the remote control circuit board controls the touch control circuit board;

the column further comprises a hollow stand column, a first slant rod with a front end and a rear end and a cross rod with an upper end and a lower end;

wherein the hollow stand column is inserted on the base, the lower end of the cross rod is connected on the stand column through a first sliding sleeve slidably attached to the hollow stand column, of the first sliding sleeve sliding up and down the hollow stand column, the upper end of the cross rod is connected to the umbrella frame, and the front end and the rear end of the first slant rod are respectively hinged to the top end of the stand column and the middle of the cross rod; and the touch control circuit board, the remote control circuit board connected to the control circuit through wires passing through the first slant rod and/or the cross rod;

the power supply assembly further comprises an upper conductive base and a lower conductive base disposed on the hollow stand column;

the upper conductive base has a positive spring and a negative spring inside the positive spring;

the lower conductive base has a positive conductive sheet and a negative conductive sheet, and the negative conductive sheet and the positive conductive sheet are fixed into the lower conductive base in such a way that the negative conductive sheet is sleeved inside the positive conductive sheet; and the upper conductive base and the lower conductive base are electrically connected to each other respectively through the positive spring and the negative conductive sheet and through the negative spring and the positive conductive sheet, and meanwhile, the upper conductive base is connected to the power plug while the lower conductive base is connecting to the power supply element.

2. The easily controllable umbrella of claim 1, wherein the plurality of lighting elements comprises light bars respectively disposed on the plurality of ribs.

3. The easily controllable umbrella of claim 2, wherein each of the plurality of ribs is U-shaped and has a U-shaped groove for receiving a light bar and a neck for receiving a lampshade.

4. The easily controllable umbrella of claim 1, wherein the middle of the base extends upward to form a mounting base into which the hollow stand column is inserted, a groove for receiving the lower conductive base is formed on the top of the mounting base, and the upper conductive base has a round hole formed thereon and is fixed onto the stand column through the round hole;

additionally, a cavity matched with the power supply element is further formed on the base, with the power supply element being mounted in the cavity and fixed by a cover plate wherein a third circuit is provided between the bottom of the cavity and the bottom of the groove, by which the power supply element is connected to the lower conductive base.

5. The easily controllable umbrella of claim 1, wherein the column comprises a stand column, a second slant rod with two ends and a hollow bent arm with a front end and a lower end;

the stand column is disposed on the base, the front end of the bent arm is connected to the umbrella frame and the lower end thereof is connected to one end of the second slant rod, the other end of the second slant rod is disposed on the stand column through a second sliding sleeve in such a way of being capable of sliding up and down, and an upper end of the stand column is connected to the middle of the bent arm in a rotatable manner; and the touch control circuit board, the remote control circuit board and the power plug are disposed in an inner chamber of the bent arm and connected to the control circuit through a circuit penetrated through the bent arm.

* * * * *